(12) United States Patent
Kerr

(10) Patent No.: US 6,620,489 B2
(45) Date of Patent: Sep. 16, 2003

(54) SELF-ADHERING IMAGE

(75) Inventor: Roger S. Kerr, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 45 days.

(21) Appl. No.: 09/911,785

(22) Filed: Jul. 24, 2001

(65) Prior Publication Data
US 2003/0021932 A1 Jan. 30, 2003

(51) Int. Cl.[7] .............................................. B32B 31/20
(52) U.S. Cl. ...................... 428/195; 428/220; 156/182; 156/249; 156/277; 156/289; 156/308.2; 156/323; 430/2
(58) Field of Search .............................. 156/182, 247, 156/289, 323, 249, 277, 308.2; 428/13, 41.7, 41.8, 42.1, 42.2, 195, 202, 204, 220; 430/2, 13, 14, 18, 32, 48, 124, 132, 358, 363, 365

(56) References Cited

U.S. PATENT DOCUMENTS

| | | |
|---|---|---|
| 5,203,942 A | 4/1993 | DeCook et al. |
| 5,268,708 A | 12/1993 | Harshbarger et al. |
| 5,370,960 A * | 12/1994 | Cahill et al. ................. 430/124 |
| 5,478,434 A | 12/1995 | Kerr et al. |
| 5,601,959 A * | 2/1997 | Brault et al. ................. 430/126 |
| 6,489,266 B1 * | 12/2002 | Kurokawa et al. .......... 503/227 |

OTHER PUBLICATIONS

Kerr, "Laminator Assembly Having a Pressure Roller with a Deformable Layer", USSN 09/676,877, (78274/NAB), filed Sep. 29, 2000.

* cited by examiner

Primary Examiner—Richard Crispino
Assistant Examiner—Sing P Chan
(74) Attorney, Agent, or Firm—Buskop Law Group, P.C.

(57) ABSTRACT

A self-adhering image made by the steps comprising: forming an imaged receiver sheet (140) having an image (230), a first thermoplastic layer (304), and a first support layer (150); laminating an imageless receiver sheet (160) with a second thermoplastic layer (308) and a second support layer (170) with the imaged receiver sheet (140) thereby encapsulating the image (230) between the first thermoplastic layer (304) and the second thermoplastic layer (308); removing the first support layer (150); removing the second support layer (170); and forming an encapsulated image capable of self-adhering to a surface.

51 Claims, 6 Drawing Sheets

SELF-ADHERING IMAGE

FIELD OF THE INVENTION

This invention relates in general to pre-press color proofs and in particular to a pre-press color proof with self-adhering properties.

BACKGROUND OF THE INVENTION

Pre-press proofing is a procedure that is used primarily by the printing industry for creating representative images of printed material. In the printing industry pre-press proofs are used to check for color balance, control parameters, or other important image quality requirements. The intended images may require several corrections and may be required to be reproduced several times to satisfy or meet the requirements of the customer. If a pre-press proof were to be produced on a printing press by producing plates, setting up the printing press, and actually produce an example of an intended image the pre-press proof would result in higher costs and a loss of profits that would ultimately be passed on to the customer.

Generally speaking, pre-press color proofs are sometimes called "off press proof," color proof, or even just a proof. Although there are several ways to create a pre-press proof they are generally one of three types. The first being a color overlay that employs the intended image on a separate base for each color. The second, a single integral sheet process in which the separate colors for the intended image are transferred by lamination onto a single base. The third, a digital method in which the images are produced directly onto or transferred by lamination onto a single base from digital data.

To create a pre-press proof first an original image is separated into individual color separations or digital files. The original image is scanned and separated into the three subtractive primaries and black. Typically a color scanner is used to create the color separations or digital files and in some instances, more than four color separations or digital files are used. Although there are several ways used in the printing industry to create a pre-press proof from the color separations or digital files they are generally one of three types. The first method being a color overlay system that employs the representative image on a separate base for each color, which are then overlaid to create a pre-press proof. The second, a single integral sheet process in which the separate colors for the representative image is transferred one at a time by lamination onto a single base. The third, a digital method in which the representative image is produced directly onto a receiver stock, or onto an intermediate sheet then transferred by lamination onto a receiver stock from digital files.

The representative image to be laminated can be created on, but is not limited to, a commercially available Kodak image processing apparatus, depicted in commonly assigned U.S. Pat. No. 5,268,708, which describes an image processing apparatus having half-tone color imaging capabilities. The above-mentioned image processing apparatus is arranged to form a representative image onto a sheet of thermal print media in which dye from a sheet of dye donor material is transferred to the thermal print media, by applying a sufficient amount of thermal energy to the dye donor sheet material to form the representative image. The image processing apparatus is comprised generally of a material supply assembly, and a lathe bed scanning subsystem. The scanning subsystem includes: a lathe bed scanning frame, translation drive, translation stage member, printhead, imaging drum, and media exit transports.

The operation of the image processing apparatus comprises of metering a length of the thermal print media (in roll form) from the material supply assembly. The thermal print media is then measured and cut into sheet form of the required length and transported to the imaging drum, registered, wrapped around, and secured onto the imaging drum. Next a length of dye donor material (in roll form) is also metered out of the material supply assembly, then measured and cut into sheet form of the required length. It is then transported to the imaging drum wrapped around the imaging drum utilizing a load roller which is described in detail, in commonly assigned U.S. Pat. No. 5,268,708, such that it is superposed in the desired registration with respect to the thermal print media (which has already been secured to the imaging drum.)

After the dye donor sheet material is secured to the periphery of the imaging drum the scanning subsystem or write engine provides the imaging function. This image function is accomplished by retaining the thermal print media and the dye donor sheet material on the imaging drum while it is rotated past the printhead. The translation drive traverses the printhead and translation stage member axially along the axis of the imaging drum, in coordinated motion with the rotating imaging drum. These movements combine to produce the representative image on the thermal print media.

Once the representative image has been formed on the thermal print media, the dye donor sheet material is then removed from the imaging drum. This is accomplished without disturbing the thermal print media that is beneath it. The dye donor sheet material is then transported out of the image processing apparatus by means of the material exit transport. Additional dye donor sheet materials featuring other desired dyes are sequentially superimposed with the thermal print media on the imaging drum and then imaged onto the thermal print media as previously mentioned, until the representative image is completed on the thermal print media. The representative image formed thereon is then unloaded from the imaging drum and transported by the receiver sheet material exit transport to an exit tray in the exterior of the image processing apparatus.

After a representative image has been formed on the thermal print media as previously described it is transferred to a receiver stock such that the pre-press proof is representative of the image that will be printed by the printing press. A Kodak laminator as described in U.S. Pat. No. 5,478,434 can be used to bond or laminate the representative image as a part of a pre-press proofing system. As additional references U.S. Pat. No. 5,203,942 describes a Kodak laminator that employs a lamination/de-lamination system as applied to a drum laminator and pending U.S. patent application Ser. No. 09/676,877, filed Sep. 29, 2000, describes a Kodak laminator that employs endless belts incorporated into the lamination apparatus. For the purpose of this patent application the laminator described in U.S. patent application Ser. No. 09/676,877 will be used. It should be noted that the present invention described in this disclosure is not limited to a Kodak laminator or type of laminator referenced above.

The receiver stock can be sheet-fed press printing stock, specially coated paper stock, or previously laminated stock. In this latter case a sheet of pre-laminate, which has a pre-laminate support layer consisting of a suitable base material, optionally coated with a releasing material, and a thermoplastic layer, is placed on top of a receiver sheet, which is also called receiver stock in the industry. This construction of multiple layers is a lamination sandwich, which is fed into the laminator. Once the lamination sandwich exits the laminator the pre-laminate support layer is peeled away from the now pre-laminated receiver stock. Any of the laminators referred to above can be used to affect the transfer of the pre-laminate receiving layer to the receiver stock.

Images can also be generated by many means such as laser thermal, inkjet thermal, silver halide, or other methods well known in the art. It should be known that not all images require lamination.

The above-described lamination method works well for pre-press proofs. There exists a need for a self-adhering image.

SUMMARY OF THE INVENTION

An object of the present invention is to provide a method for producing a self-adhering image.

While self-adhering images know today and are generated by printing on a plastic material by means of a printing press on web format then converted to a sheet format and requires many images or sheets to be printed. This does not allow images to be generated as pre-press proofs or just as a single image generated by means of a inkjet printer. Without a support layer thin plastic material in sheet format can not be moved through the printer.

The invention involves a self-adhering image made by the steps comprising: forming an imaged receiver sheet having an image, a first thermoplastic layer, and a first support layer; consisting of a first support base, first aluminized layer, and first release layer. Laminating an imageless receiver sheet with a second thermoplastic layer and a second support layer; consisting of a second support base, second aluminized layer, and second release layer with the imaged receiver sheet thereby encapsulating the image between the first thermoplastic layer and the second thermoplastic layer; removing the first support layer; removing the second support layer; and forming a self-adhering image capable of adhering to a surface.

The invention also involves a self-adhering image made by the steps comprising: forming an imaged receiver sheet having an image, a first thermoplastic layer, and a first support layer, consisting of a first support base, aluminized layer, and first release layer; laminating a plastic sheet with a second thermoplastic layer and a second support layer which is preferably clear; consisting of a second support base and second release layer with the imaged receiver sheet thereby encapsulating the image between the first thermoplastic layer and the second thermoplastic layer; removing the first support layer and the second support layer; forming a self-adhering image capable of adhering to a surface.

The invention also involves a self-adhering image made by the steps comprising: forming an imaged receiver sheet having an image, a thermoplastic layer, and a support layer; consisting of a support base, aluminized layer, and release layer; laminating a plastic sheet which is preferably clear with the imaged receiver sheet thereby encapsulating the image between the thermoplastic layer and the plastic sheet; removing the support layer; and forming an encapsulated image capable of adhering to a surface.

The invention also involves a self-adhering image made by the steps comprising: forming an imaged receiver sheet having an image, a plastic layer, and a support layer; consisting of a support base and release layer; removing the support layer; and forming an encapsulated image capable of adhering to a surface.

Images can also be generated by many means such as laser thermal, inkjet thermal, silver halide, or other methods well known in the art. The present invention works well for images that require but can also be used with images that lamination is not required.

The invention, and its objects and advantages, will become more apparent, in the detailed description of the preferred embodiments presented below.

BRIEF DESCRIPTION OF THE DRAWINGS

In the detailed description of the preferred embodiments of the invention presented below, reference is made to the accompanying drawings, in which.

DETAILED DESCRIPTION OF THE INVENTION

The present invention will be directed, in particular, to elements forming part of, or cooperating more directly with an apparatus in accordance with the present invention. It is to be understood that elements not specifically shown or described may take various forms well known to those skilled in the art. For the sake of discussion, but not limitation, the preferred embodiment of the present invention will be illustrated in relation to a laminating apparatus for making pre-press proofs.

Figure 1:
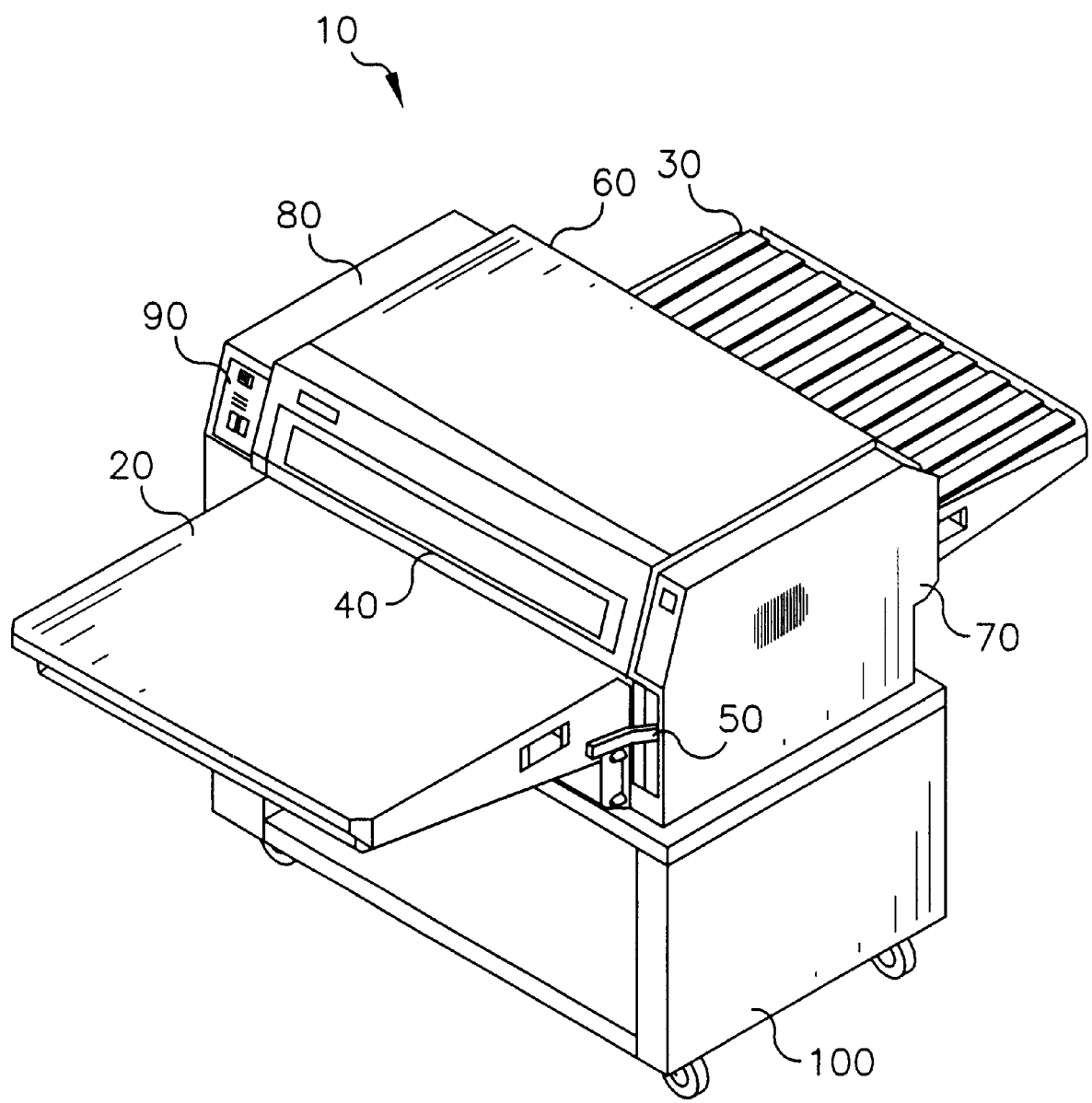
FIG. 1 is a perspective view showing a laminator known in the related art used with the present invention.

Referring to the drawings wherein like reference numerals represent identical or corresponding parts throughout the several views. Referring to FIG. 1, there is shown perspective view of laminator 10 as described in U.S. patent application Ser. No. 09/676,877. The laminator has an entrance table 20, exit table 30, entrance slot 40, pressure lever 50, top cover 60, right side cover 70, left side cover 80, control panel 90, and lamination base 100.

Figure 2:
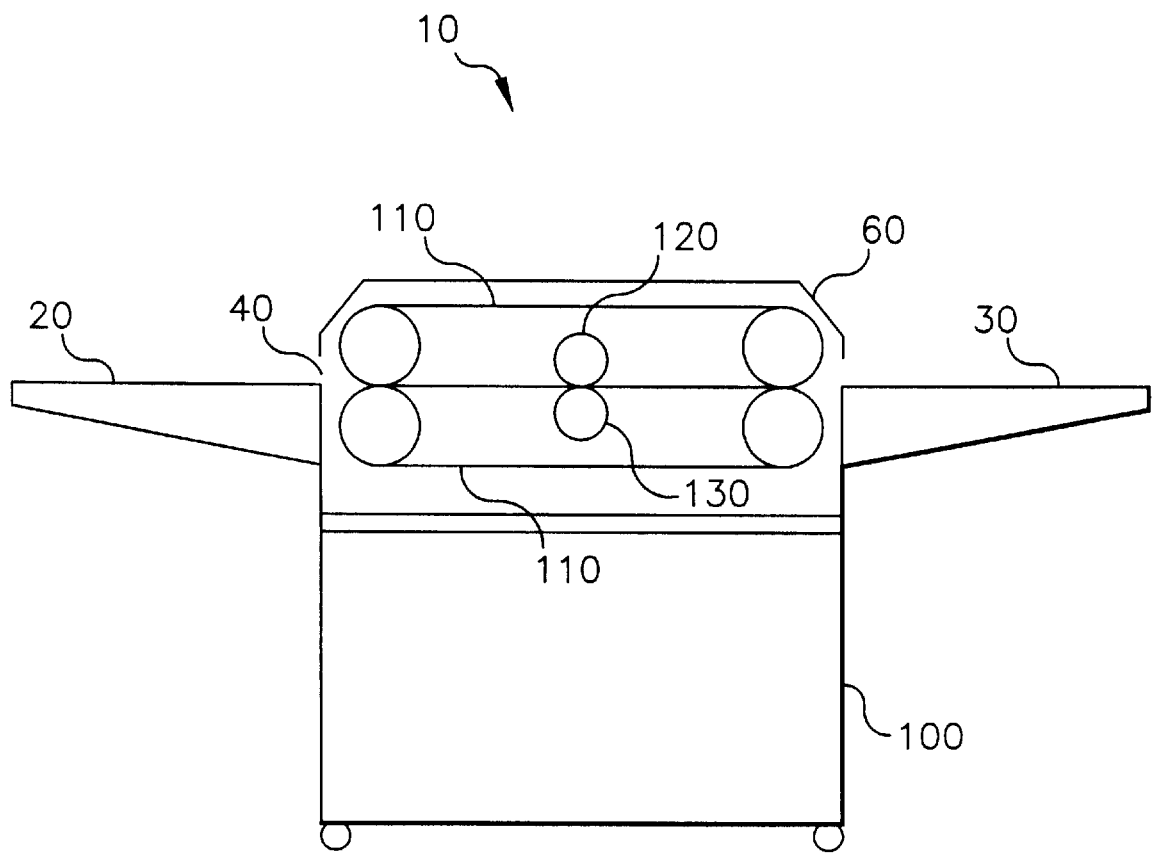
FIG. 2 is a perspective exploded view of the laminator known in the related art of FIG. 1.

FIG. 2 is a schematic right side elevation of the laminator of FIG. 1 showing endless belts 110 with upper lamination roller 120 and lower lamination roller 130 which convey the media to be laminated through the laminator 10. Media to be bonded or laminated passes between the endless belts 110. Upper lamination roller 120 and lower lamination roller 130 provide heat and pressure to laminate the desired media together. This configuration with upper lamination roller 120 and lower lamination roller 130 is called a "straight-through" laminator. Although the illustrated embodiments show both the upper lamination roller 120 and lower lamination roller 130 as heated pressure rollers, it also should be recognized that of the upper lamination roller 120 and lower lamination roller 130 only one may be required to be heated. It is further recognized that both upper lamination roller 120 and lower lamination roller 130 do not have to be heated for cold lamination applications.

The following methods are usable for forming a pre-press proof with a resolution of between about 1000 and 4000 dpi, although in the most preferred embodiment, the resolution is between 1800 and 3000 dpi. The thermoplastic layers have a thickness range from 1 to about 75 microns.

Generally laminating a pre-press proof of this type is a two-pass process, the present invention contemplates a single pass lamination construction and images that require no lamination as well. The image can be initially created on thermal print media with an inkjet printer, laser printer, or any other printing method known in the art.

Figure 3:
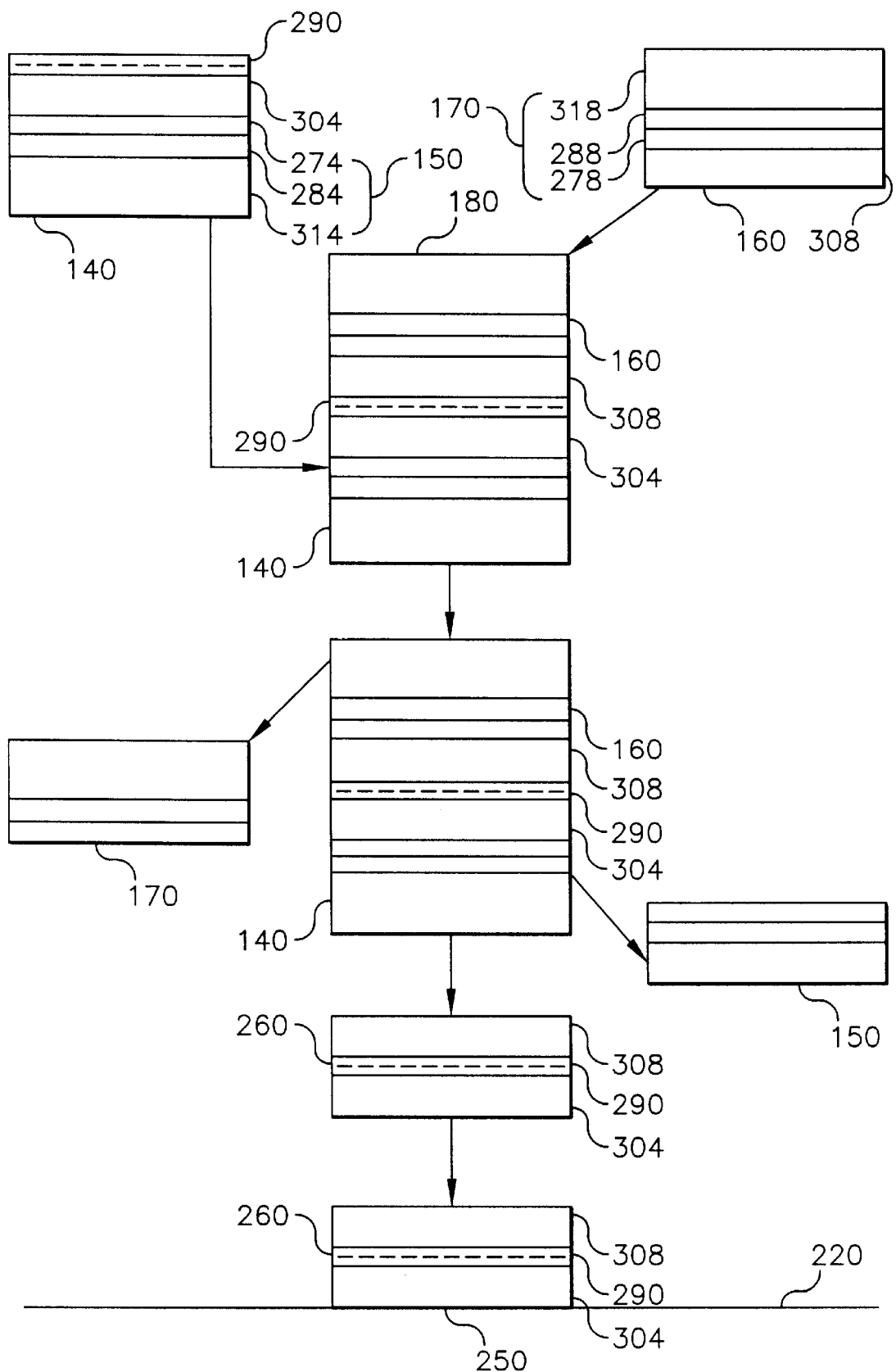
FIG. 3 is a block diagram showing an embodiment of a method for producing a self-adhering image of the present invention.

Referring to FIG. 3 a block diagram is shown outlining a method for producing a self-adhering image. Consisting of the steps of: creating an imaged receiver sheet 140 consisting of a representative image 290 formed on a first thermoplastic layer 304 and a first support layer 150 having a first support base 314, first aluminized layer 284, and a first release layer 274. It should be noted that first support layer 150 may be comprised of several layers or a single support base 310. Laminating said imaged receiver sheet 140 to an imageless receiver sheet 160 consisting of a second thermoplastic layer 308 and a second support layer 170 having a second support base 318, second aluminized layer 288 and a second release layer 278. It should be noted that second support layer 170 may be comprised of several layers or a single support base 310. Thereby encapsulating the representative image 290 between the first thermoplastic layer 304 and second thermoplastic layer 308: removing the first support layer 150, removing the second support layer 170 thereby forming a self-adhering image 260 capable of adhering to a surface 220.

Figure 4:
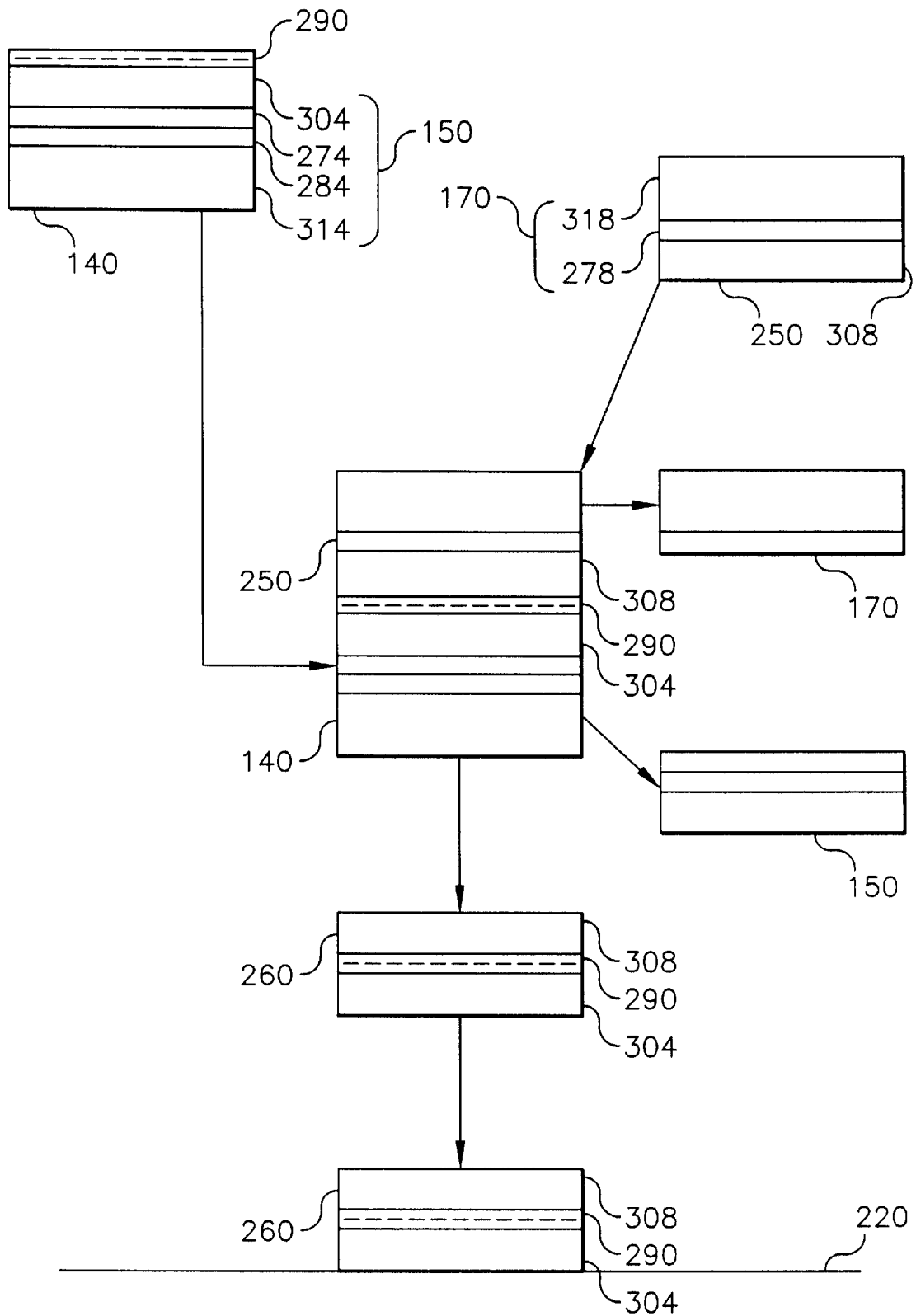
FIG. 4 is a block diagram showing another embodiment of a method for producing a self-adhering image of the present invention.

Referring to FIG. 4 a block diagram is shown outlining another method for producing a self-adhering image. Consisting of the steps of: creating an imaged receiver sheet 140 consisting of a representative image 290 formed on a first thermoplastic layer 304 and a first support layer 150 having a first support base 314, first aluminized layer 284 and a first release layer 274. It should be noted that first support layer 150 may be comprised of several layers or a single support base 310. Laminating the imaged receiver sheet 140 to a plastic sheet 250 consisting of a second thermoplastic layer 308 and a second support layer 170 having a second support base 318 and a second release layer 278. It should be noted that second support layer 170 may be comprised of several layers or a single support base 310 thereby encapsulating the representative image 290 between the first thermoplastic layer 304 and second thermoplastic layer 308: removing the first support layer 150, removing the second support layer 170 thereby forming a self-adhering image 260 capable of adhering to a surface 220.

Figure 5:
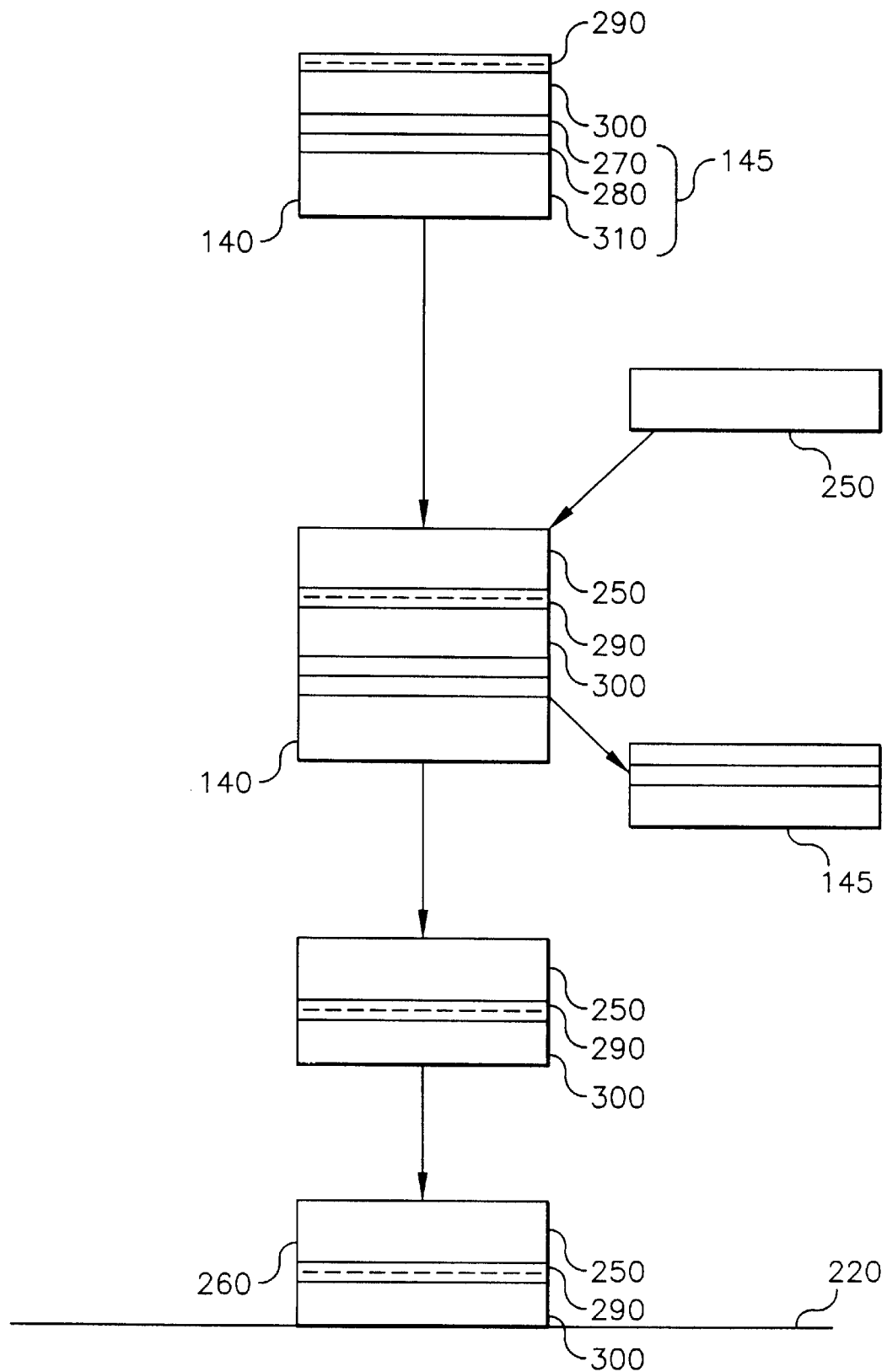
FIG. 5 is a block diagram showing another embodiment of a method for producing a self-adhering image of the present invention.

Referring to FIG. 5 a block diagram is shown outlining another method for producing a self-adhering image. Consisting of the steps of: creating an imaged receiver sheet 140 consisting of a representative image 290 formed on a thermoplastic layer 300 and a support layer 145 having a support base 310, aluminized layer 280 and a release layer 270. It should be noted that support layer 145 may be comprised of several layers or a single support base 310. Laminating the imaged receiver sheet 140 to a plastic sheet 250. Thereby encapsulating the representative image 290 between the thermoplastic layer 300 and the plastic sheet 250. Removing the support layer 145 thereby forming a self-adhering image 260 capable of adhering to a surface 220.

Figure 6:
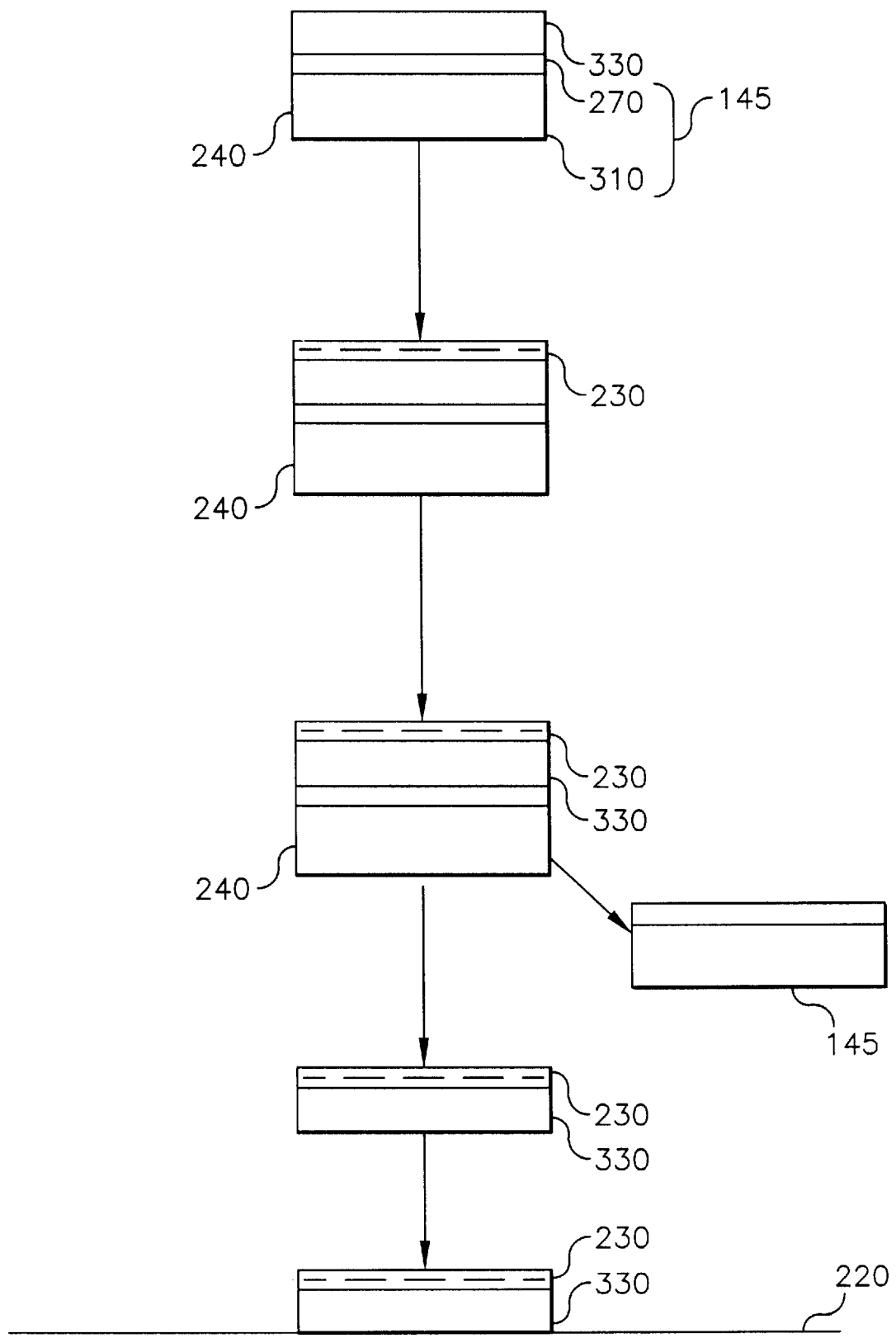
FIG. 6 is a block diagram showing another embodiment of a method for producing a self-adhering image of the present invention.

Referring to FIG. 6 a block diagram is shown outlining another method for producing a self-adhering image. Consisting of the steps of: creating an image 230 on a receiver sheet 240 consisting of a plastic layer 330, a support layer 145 having a support base 310, and a release layer 270 it should be noted that support layer 145 may be comprised of several layers or a single support base 310. Removing support layer 145 thereby forming a self-adhering image 260 capable of adhering to a surface 220.

The invention has been described in detail with particular reference to certain preferred embodiments thereof, but it will be understood that variations and modifications of the invention can be effected within the spirit and scope of the invention.

PARTS LIST

10. Laminator
20. Entrance table
30. Exit table
40. Entrance slot
50. Pressure lever
60. Top cover
70. Right side cover
80. Left side cover
90. Control panel
100. Lamination base
110. Endless belts
120. Upper lamination roller
130. Lower lamination roller
140. Imaged receiver sheet
145. Support layer
150. First support layer
160. Imageless receiver sheet
170. Second support layer
220. Surface
230. Image
240. Receiver sheet
250. Plastic sheet
260. Self-adhering image
270. Release layer
274. First release layer
278. Second release layer
280. Aluminized layer
284. First aluminized layer
288. Second aluminized layer
290. Representative Image
300. Thermoplastic layer
304. First thermoplastic layer
308. Second thermoplastic layer
310. Support base
314. First support base
318. Second support base
330. Plastic layer

What is claimed is:

1. A self-adhering image made by the steps comprising:
   a) forming an imaged receiver sheet having an image, a first thermoplastic layer, and a first support layer;
   b) laminating an imageless receiver sheet with a second thermoplastic layer and a second support layer with said imaged receiver sheet thereby encapsulating said image between said thermoplastic layers;
   c) removing said first support layer;
   d) removing said second support layer thereby forming an encapsulated image capable of self-adhering to a surface; and wherein said imaged receiver sheet has a resolution of between 1800 dpi and 4000 dpi.

2. The self-adhering image of claim 1, wherein said surface is a wall.

3. The self-adhering image of claim 1, wherein said surface is a refrigerator.

4. The self-adhering image of claim 1, wherein said surface is a media selected from the group: paper, notebooks, glass, steel, wood, and combinations thereof.

5. The self-adhering image of claim 1, wherein said plastic sheet has a thickness ranging from 1 to 150 microns, and is clear.

6. The self-adhering image of claim 5, wherein said plastic sheet has a thickness ranging from 1 to 50 microns.

7. The self-adhering image of claim 1, wherein said clear support layer is a peelable support layer having a thickness between 1 and 1600 microns.

8. The self-adhering image of claim 1, wherein said imaged receiver sheet has an image formed by a laser printer, or an inkjet printer.

9. The self-adhering image of claim 1, wherein said image is formed from halftone dots.

10. The self-adhering image of claim 1, wherein said image is a continuous tone, non-dot image.

11. The self-adhering image of claim 1, wherein said image is monochromatic.

12. The self-adhering image of claim 1, wherein said image is multi-color.

13. The self-adhering image of claim 1, wherein said image is a digital image.

14. The self-adhering image of claim 13, wherein said digital image further comprises a laminated overcoat.

15. The self-adhering image of claim 13, wherein said digital image further comprises a laminated, continuous layer with a peel able support.

16. The self-adhering image of claim 1, wherein said image is from an inkjet printer, a laser thermal printer, a fax machine, a thermal machine, and an electro photographic machine.

17. The self-adhering image of claim 1, wherein said image is a hologram.

18. A self-adhering image made by the steps comprising:
   a) forming an imaged receiver sheet having an image, a first thermoplastic layer, and a support layer;
   b) laminating a plastic sheet with a second thermoplastic layer and a support layer with said imaged receiver sheet thereby encapsulating said image between said thermoplastic layers;
   c) removing said support layers thereby forming an encapsulated image capable of self-adhering to a surface; and
   wherein said imaged receiver sheet has a resolution of between 1800 dpi and 4000 dpi.

19. The self-adhering image of claim 18, wherein said surface is a wall.

20. The self-adhering image of claim 18, wherein said surface is a refrigerator.

21. The self-adhering image of claim 18, wherein said surface is a media selected from the group: paper, notebooks, glass, steel, wood, and combinations thereof.

22. The self-adhering image of claim 18, wherein said plastic sheet has a thickness ranging from 1 to 150 microns, and is clear.

23. The self-adhering image of claim 22, wherein said plastic sheet has a thickness ranging from 1 to 50 microns.

24. The self-adhering image of claim 18, wherein said clear support layer is a peelable support layer having a thickness between 1 and 1600 microns.

25. The self-adhering image of claim 18, wherein said imaged receiver sheet has an image formed by a laser printer, or an inkjet printer.

26. The self-adhering image of claim 18, wherein said image is formed from halftone dots.

27. The self-adhering image of claim 18, wherein said image is a continuous tone, non-dot image.

28. The self-adhering image of claim 18, wherein said image is monochromatic.

29. The self-adhering image of claim 18, wherein said image is multi-color.

30. The self-adhering image of claim 18, wherein said image is a digital image.

31. The self-adhering image of claim 30, wherein said digital image further comprises a laminated overcoat.

32. The self-adhering image of claim 30, wherein said digital image further comprises a laminated, continuous layer with a peelable support.

33. The self-adhering image of claim 18, wherein said image is from an inkjet printer, a laser thermal printer, a fax machine, a thermal machine, and an electrophotographic machine.

34. The self-adhering image of claim 18, wherein said image is a hologram.

35. A self-adhering image made by the steps comprising:
   a) forming an imaged receiver sheet having an image, a thermoplastic layer, and a support layer;
   b) laminating a plastic sheet with said imaged receiver sheet thereby encapsulating said image between said thermoplastic layer and said plastic sheet;
   c) removing said support layer thereby forming an encapsulated image capable of self-adhering to a surface; and
   wherein said imaged receiver sheet has a resolution of between 1800 dpi and 4000 dpi.

36. The self-adhering image of claim 35, wherein said surface is a wall.

37. The self-adhering image of claim 35, wherein said surface is a refrigerator.

38. The self-adhering image of claim 35, wherein said surface is a media selected from the group: paper, notebooks, glass, steel, wood, and combinations thereof.

39. The self-adhering image of claim 35, wherein said plastic sheet has a thickness ranging from 1 to 150 microns, and is clear.

40. The self-adhering image of claim 39, wherein said plastic sheet has a thickness ranging from 1 to 50 microns.

41. The self-adhering image of claim 35, wherein said support layer is a peelable support layer having a thickness between 1 and 1600 microns.

42. The self-adhering image of claim 35, wherein said imaged receiver sheet has an image formed by a laser printer, or an inkjet printer.

43. The self-adhering image of claim 35, wherein said image is formed from halftone dots.

44. The self-adhering image of claim 35, wherein said image is a continuous tone, non-dot image.

45. The self-adhering image of claim 35, wherein said image is monochromatic.

46. The self-adhering image of claim 35, wherein said image is multi-color.

47. The self-adhering image of claim 35, wherein said image is a digital image.

48. The self-adhering image of claim 47, wherein said digital image further comprises a laminated overcoat.

49. The self-adhering image of claim 47, wherein said digital image further comprises a laminated, continuous layer with a peelable support.

50. The self-adhering image of claim 35, wherein said image is from an inkjet printer, a laser thermal printer, a fax machine, a thermal machine, and an electrophotographic machine.

51. The self-adhering image of claim 35, wherein said image is a hologram.

* * * * *